(12) United States Patent
Van Schaijk

(10) Patent No.: US 7,579,239 B2
(45) Date of Patent: Aug. 25, 2009

(54) METHOD FOR THE MANUFACTURE OF A NON-VOLATILE MEMORY DEVICE AND MEMORY DEVICE THUS OBTAINED

(75) Inventor: Robertus Theodorus Fransiscus Van Schaijk, Leuven (BE)

(73) Assignee: NXP B.V., Eindhoven (NL)

( * ) Notice: Subject to any disclaimer, the term of this patent is extended or adjusted under 35 U.S.C. 154(b) by 453 days.

(21) Appl. No.: 10/571,948

(22) PCT Filed: Aug. 30, 2004

(86) PCT No.: PCT/IB2004/051601

§ 371 (c)(1),
(2), (4) Date: Mar. 13, 2006

(87) PCT Pub. No.: WO2005/027220

PCT Pub. Date: Mar. 24, 2005

(65) Prior Publication Data

US 2006/0292792 A1    Dec. 28, 2006

(30) Foreign Application Priority Data

Sep. 16, 2003    (EP)    .................................. 03103400

(51) Int. Cl.
*H01L 21/336*    (2006.01)

(52) U.S. Cl. .................. 438/258; 438/267; 257/E21.69
(58) Field of Classification Search ................ 438/258, 438/267, 304, 596; 257/E21.69
See application file for complete search history.

(56) References Cited

U.S. PATENT DOCUMENTS

| 6,091,104 A | | 7/2000 | Chen |
| 6,133,098 A | * | 10/2000 | Ogura et al. ................. 438/267 |
| 2002/0137290 A1 | | 9/2002 | Wils et al. |

FOREIGN PATENT DOCUMENTS

| WO | WO 00/51188 | 8/2000 |
| WO | WO 03/015151 | 2/2003 |
| WO | WO 03/015172 | 2/2003 |

* cited by examiner

*Primary Examiner*—Chandra Chaudhari

(57) ABSTRACT

The present invention relates to a method for processing of a non-volatile memory cell (50) which comprises a double gate stack and a single access gate. The method combines a way of processing an access gate with drain implant, separate from source implant, in a self-aligned manner. The method of the present invention does not require mask alignment sensitivity and makes it possible to implant self-aligned an extended drain for erasing of the memory device. Furthermore, the method provides a way of performing separately drain and source implant with different doping without the use of an additional mask.

8 Claims, 4 Drawing Sheets

METHOD FOR THE MANUFACTURE OF A NON-VOLATILE MEMORY DEVICE AND MEMORY DEVICE THUS OBTAINED

The present invention relates to the field of non-volatile semiconductor memories.

Non-volatile memories (NVMs) are used in a wide variety of commercial and military electronic devices and equipment, such as e.g. hand-held telephones, radios and digital cameras. The market for these electronic devices continues to demand devices with a lower voltage, lower power consumption and a decreased chip size.

Flash memories or flash memory cells comprise a MOSFET with a floating gate between a control gate and a channel region. With the improvement of fabrication technologies, the floating gate size has been reduced to nanometer scale. These devices are basically miniature EEPROM cells in which electrons (or holes) are injected in a nanofloating gate by tunnel effect through an oxide barrier. Charges stored in the floating gate modify the device threshold voltage. Stacked gate technology is applied in the fabrication of modern non-volatile memory (NVM) cells with very high density. A schematic representation of a 2 transistor (2-T) flash EEPROM cell 10 is depicted in FIG. 1. A 2 transistor (2-T) flash EEPROM cell 10 comprises a storage transistor or memory gate stack 1 and a selecting transistor or access gate 2. A schematic cross-section through a compact 2-T flash EEPROM cell 10 is given in FIG. 2. In such memory cells 10, the access gate 2 and the memory gate stack 1 are isolated from each other by an isolation spacer 3. In a typical 2-T flash memory cell, this isolation is a TEOS (Tetraethyl Orthosilicate —Si(OC$_2$H$_5$)$_4$)— spacer. The gate stack 1 comprises a charge storing region 4 which can be for example a floating gate, an inter-poly dielectric 5 and a control gate 6.

In WO 03/015152, a method of manufacturing a non-volatile memory is described, the NVM comprising a memory cell with a first gate structure 11 with a control gate 12 and a charge storage region 13 situated between the control gate 12 and a semiconductor body 14, and a second gate structure 15 with an access gate 16, as illustrated in FIG. 3.

In a first step the first gate structure 11 with the control gate 12 and the charge storage region 13, which in a particular embodiment of the invention is a floating gate, is formed on a surface of the semiconductor body 14. The first gate structure 11 comprises a tunnel dielectric 17, a floating gate 13, an intergate dielectric 18 and a top layer 19. The sidewalls 20 are covered with an insulating layer 21.

Next, a relatively thick conductive layer is deposited on and next to the first gate structure 11. The conductive layer is then planarized until the top layer 19 of the first gate structure 11 is exposed. After that, the conductive layer is patterned so as to form at least part of the second gate structure 15 adjoining the first gate structure 11. Patterning of the conductive layer comprises the following steps. First, the planarized conductive layer is etched back in order to expose an upper portion 22 of the sidewalls 20 of the first gate structure 11. Then, a spacer 23 is formed next to the exposed upper portion 22 of the sidewalls 20 of the first gate structure 11. In a next step the remaining part of the conductive layer is etched using the spacer 23 as a mask. In that way, the second gate structure 15 is formed comprising a gate dielectric 24 and an access gate 16.

After patterning the conductive layer to form the second gate structure 15, lightly doped source- and drain zones (LDD) 25 are formed by ion implantation. Further spacers 26 and highly doped source- and drain zones (HDD) 27 are formed next. In a last step, the source- and drain zones may be provided with a top layer of a silicide 28.

By using the above described method it is possible to form very small memory cells with relatively small costs. However, a disadvantage of this method is that two access gates 16 are provided where only one access gate 16 is preferred. Hence, the second access gate 16 has to be removed which is very difficult to do, because an extra mask and difficult poly-etch has to be provided. It would be advantageous to be able to form compact non-volatile memory cells which comprise only one access gate instead of two.

Another disadvantage of the above method is that, when different doping in source and drain regions is required, an extra mask step has to be performed.

It is an object of the present invention to provide a compact memory device comprising a memory gate stack and only one access gate and a method of making the same. It is a further aim of the present invention to allow a different doping of drain and source regions in a memory device without additional mask steps.

This objective is accomplished by a method and device according to the present invention.

The present invention provides a method for processing or manufacturing an electric device, such as e.g. a non-volatile memory cell, which comprises a double gate stack and a single access gate. The method comprises providing the double gate stack, having a first sidewall adjacent which the access gate is to be formed, and a second sidewall opposite to the first sidewall, and thereafter providing a conductive layer over and adjacent the double gate stack. The double gate stack may be formed by providing a tunnel-oxide, a floating gate or a charge trapping layer, an interlayer dielectric and a control gate. The main difference between an electric device having a charge trapping layer and an electric device having a floating gate is that in electric devices having a charge trapping layer, electrons are trapped in energy minima caused by imperfections in the charge trapping layer, e.g. nitride layer. In electric devices having a floating gate, on the other hand, charges are trapped in a floating gate layer where they cannot get out without application of an external voltage because the floating gate layer is surrounded by dielectric layers. In an electric device having a floating gate, lateral charge transport is possible inside the floating gate layer, which is not the case in an electric device having a charge trapping layer: there the charge is trapped at a substantially fixed location inside the charge trapping layer.

The double gate stack may be covered by a capping layer, which may be an insulating layer, for example a nitride or an oxide layer. The conductive layer which is deposited onto the double gate stack may for example be a polycrystalline silicon layer. The method furthermore comprises the partial removal of the conductive layer adjacent the second sidewall. With partial removal is meant that the height of the conductive layer adjacent the second sidewall is changed. After the partial removal of the conductive layer, the conductive layer is etched back, both adjacent the first sidewall and adjacent the second sidewall, until the conductive layer is substantially completely removed adjacent the second sidewall. The access gate is then formed in the remaining part of the conductive layer adjacent the first sidewall. An advantage of the method of the present invention is that because of the self-aligned process, mask alignment sensitivity is reduced, and the length of the access gate is better defined. Another advantage is that only one access gate is formed, where in the prior art methods two access gates are formed. The top surface of the remaining part of the conductive layer may be below the level of an interlayer dielectric of the double gate stack. This may be advantageous because in that way problems with high voltages on the control gate are reduced. In the prior art devices, a relatively thick oxide spacer between the control gate and the access gate is required to prevent electrical breakdown between these elements at high voltage levels, and this results in a thick oxide spacer between the charge trapping layer and the access gate which in turn results in a relatively low conductivity of the access gate channel. According to this aspect of the present invention, a relatively thin oxide spacer between the charge trapping layer and the access gate can be used without significantly increasing the risk to have electrical breakdown between control gate and access gate, resulting in a better conductivity of the access gate channel.

The method may further comprise deposition of a masking layer for masking the remaining part of the conductive layer where the access gate having an access gate length is to be formed, after etching back the conductive layer, and formation of a spacer from the masking layer for defining the length of the access gate. The masking layer may comprise a stack of layers, e.g. a first masking layer, which may for example be a nitride layer, and a second masking layer, which may for example be an oxide layer. The first masking layer may be suitable for being selectively etched towards the second masking layer. The first masking layer, e.g. nitride layer, preferably protects the STI during formation of spacers from the second masking layer, e.g. oxide layer.

The method of the present invention may further comprise forming first spacers from the second masking layer and partially removing the first masking layer using the first spacers as a hardmask. An advantage thereof is that the length of the access gate is determined by the length of the first spacers. This means, it is possible to obtain a well-defined length of the access gate, which is not the case when using a mask due to mask alignment errors. Removing of the first masking layer using the first spacers as a hardmask generates second spacers from the first masking layer, and the method may furthermore comprise removing, e.g. etching, the conductive layer using the second spacers as a hardmask. The first spacers may protect a drain region of a double gate stack during removal of the conductive layer using the second spacers as a hardmask, more particularly the first spacers may completely cover the drain region in between two neighboring double gate stacks. This allows to implement different doping levels for drain region and source region without providing a separate masking step, as the drain region may be implanted after etching back of the conductive layer but while the source region is still covered by the conductive layer, and thereafter the source region may be implanted while the drain region is covered by the second spacers.

The first masking layer may have a first thickness and the second masking layer may have a second thickness, the first thickness being smaller than the second thickness. This has the advantage that nice first spacers, e.g. oxide spacers, can be obtained.

The method of the present invention may further comprise removing the spacers. An advantage of complete removal of the first masking layer is that the access gate may be silicided and contacted.

In an embodiment of the present invention the removal of parts of the conductive layer may be performed by means of etching.

In an aspect of the method of the present invention the drain region and the source region may be separately formed without the use of an additional mask. Source and drain region may be differently doped. However, this is preferably done in a structure where the distance between two stacks is sufficiently small. A deep drain implant is needed under the double gate stack in order to be able to program the device. However, if a same deep implant also needs to be performed under the access gate, then implantation times need to be too long. Therefore a shallow source implantation is carried out.

An advantage of the method according to the present invention is the lack of mask alignment sensitivity.

Another advantage of the method described of this invention is the possibility to implant self-aligned an extended drain for erasing of the memory device.

The present invention also provides semiconductor devices made in accordance with the methods described above.

In another aspect, the present invention provides an electric device comprising a series of non-volatile memory cells, each memory cell comprising a double gate stack and a single access gate having a channel with a channel length, two adjacent double gate stacks sharing a drain region, wherein the distance in the direction of the channel between two sidewalls of two neighboring double gate stacks facing each other is less than twice the channel length of the access gate. This allows to implement drain and source separately without the use of an extra mask, thus obtaining different doping concentrations for drain and source regions.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
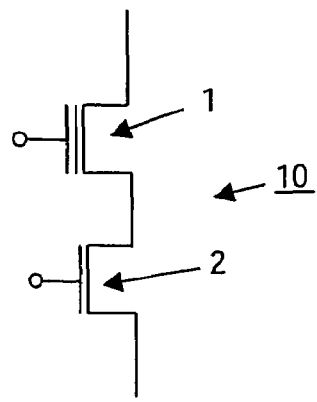
FIG. 1 is a schematic representation of a 2-T flash EEPROM cell.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

In FIG. 4-9 successive stages for the manufacture of a non-volatile memory cell 50 according to a first embodiment of the method of the present invention are shown.

A substrate 31 of a first conductivity type is provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. In the following reference will be made to silicon processing as silicon semiconductors are commonly used, but the skilled person will appreciate that the present invention may be implemented based on other semiconductor material systems and that the skilled person can select suitable materials as equivalents of the dielectric and conductive materials described below.

According to an embodiment of the present invention first a conventional stacked gate forming the memory gate stack 1 is formed. This may e.g. be done by growing, on the substrate 31, e.g. a silicon substrate, a tunnel barrier, which is for example a relatively thin tunnel oxide layer 32 which has e.g. a thickness of 7 nm. On top of this tunnel oxide layer 32, a floating gate layer, for example a first polysilicon layer, may be deposited. This first polysilicon layer may for example be 100 nm thick. Thereafter, the first polysilicon layer is doped, preferably highly doped with, for example, n-type dopants, such as arsenic (As) or phosphorus (P), leading to a doped first polysilicon layer. With highly doped is meant a dopant concentration of at least $6e19/cm^3$, preferably $3e20/cm^3$ or more. A part of this doped first polysilicon layer will later form a floating gate 33. On top of the doped first polysilicon layer, an interlayer dielectric 34 may be deposited. The interlayer dielectric 34 may be, but is not limited to, for example, a multilayer insulator such as e.g. an oxide-nitride-oxide (ONO) layer having two oxide layers sandwiching a nitride layer. In an alternative embodiment, the interlayer dielectric 34 may be another dielectric layer, such as for example tantalum pentoxide. A control gate 35 layer, for example a 150 nm thick second polysilicon layer, may be deposited on top of the interlayer dielectric 34, and again this second polysilicon layer can be highly doped, preferably with n-type dopants, such as As or P, leading to a doped second polysilicon layer. With highly doped is meant a dopant concentration of at least $6e19/cm^3$, preferably $3e20/cm^3$ or more. A part of this doped second polysilicon layer will later form a control gate 35. An optional isolating layer or capping layer 36, e.g. made of an electrically insulating material such as nitride or oxide, may be provided on top.

It is to be appreciated that the thickness of the interlayer dielectric 34 in the figures is shown to be relatively the same as the other layers 33, 35 for ease of understanding; however, the interlayer dielectric 34 is actually very thin relative to the first polysilicon layer, forming the floating gate 33 and the second polysilicon layer, forming the control gate 35.

The stack of layers, comprising the doped second polysilicon layer, interlayer dielectric 34, the doped first polysilicon layer, the tunnel oxide layer 32 and the capping layer 36 if present, is then patterned. For example, a resist is lithographically patterned over portions of the doped second polysilicon layer. Then the doped second polysilicon layer is etched away at portions not covered by the resist. Also the interlayer dielectric 34 is substantially etched away using conventional techniques. The doped first polysilicon layer is substantially etched away using conventional etching techniques. Etching of this first polysilicon layer stops at tunnel oxide layer 32 height. Spacers 37 may then be formed next to the double gate stack. The spacers 37 may be formed by depositing oxide as for example TEOS or HTO. The subsequent spacer etch also removes exposed parts of the tunnel oxide layer 32, i.e. parts not covered by the first polysilicon layer and layers on top thereof, and ends at substrate 31 height. That way a stacked gate or double gate stack is formed. Preferably, the device is cleaned, so as to expose the surface of the silicon substrate 31 where no stacked gate is present. Then, an access gate oxide is grown onto the substrate 31.

In a next step, a thick conductive layer 38, which may, for example, be a polysilicon layer which is doped in-situ or by implantation or by a combination of both, is deposited. This conductive layer 38 may for example have a thickness of 450 nm, but may have any other thickness preferably higher than the height of stacked gate. The thickness of the conductive layer 38 is reduced, for example by chemical mechanical polishing (CMP), either down to the same height as the stacked gate or just above the stacked gate. Other techniques may also be used to remove superfluous parts of the conductive layer 38. If polycrystalline silicon is applied for the conductive layer 38, the capping layer 36 of the double gate stacks is advantageously composed of for example silicon oxide or silicon nitride. The capping layer 36 may later be used as a stopping layer during CMP and/or during (back) etching of the access gate 44 described below to prevent attack of the control gate 35.

Figure 4:
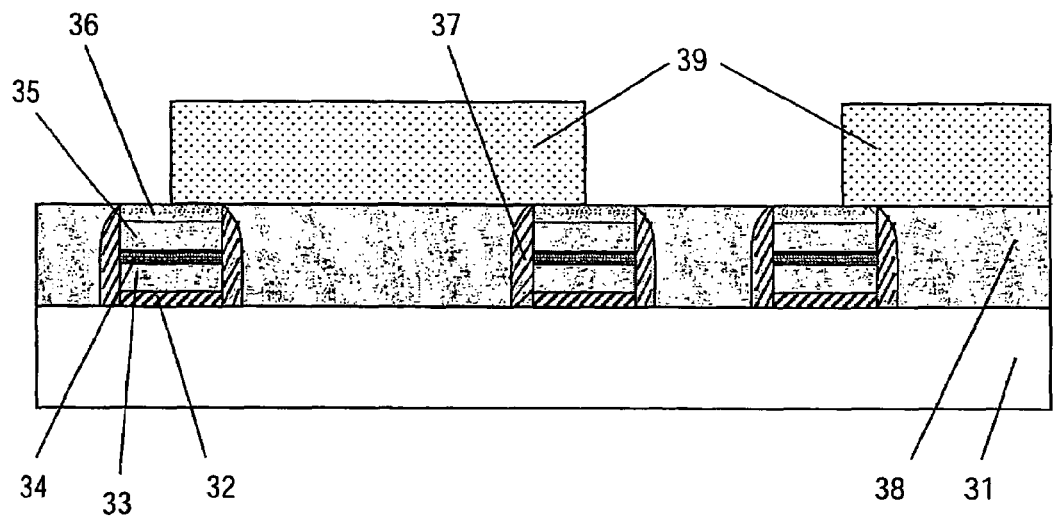
FIG. 4-9 show cross-sectional views of the successive stages in the manufacture of a non-volatile memory cell according to an embodiment of the present invention.

Then, a mask 39 is applied which extends from one double gate stack to a next one, thus covering parts of the conductive layer 38 in between two double gate stacks where later access gates 44 will be formed, as illustrated in FIG. 4. The mask 39 may be formed from any material which is suitable in view of the materials used for processing the memory device. The mask 39 is used to etch the conductive layer 38 at some locations where no access gate 44 will be present This etch results in a height difference in conductive layer 38 material between two adjacent double gate stacks in between which an access gate will be formed, compared to the height of the conductive layer 38 in between two adjacent double gate stacks where no access gate will be formed.

Figure 2:
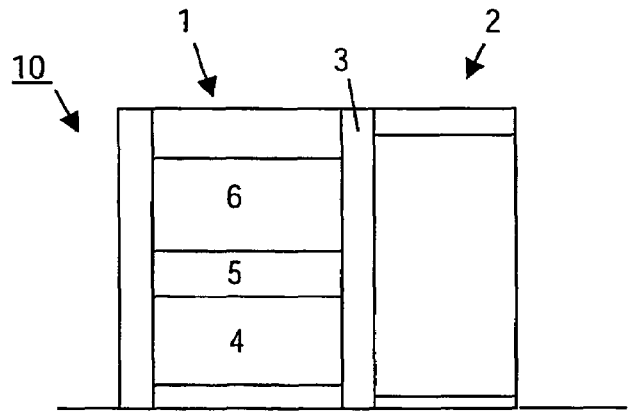
FIG. 2 is a schematic vertical cross-section through a compact 2-T flash EEPROM cell.
Figure 3:
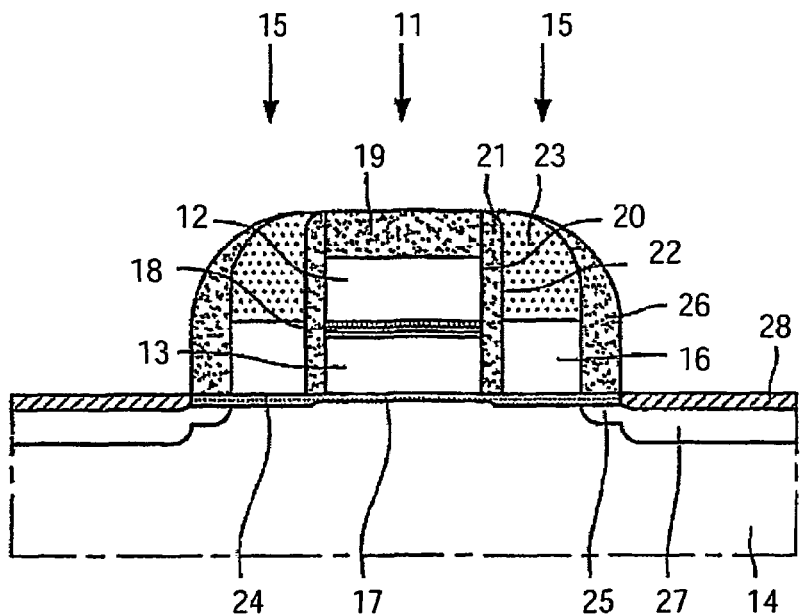
FIG. 3 is a diagrammatic cross-sectional view of a non-volatile memory cell obtained according to a prior art method.
Figure 5:
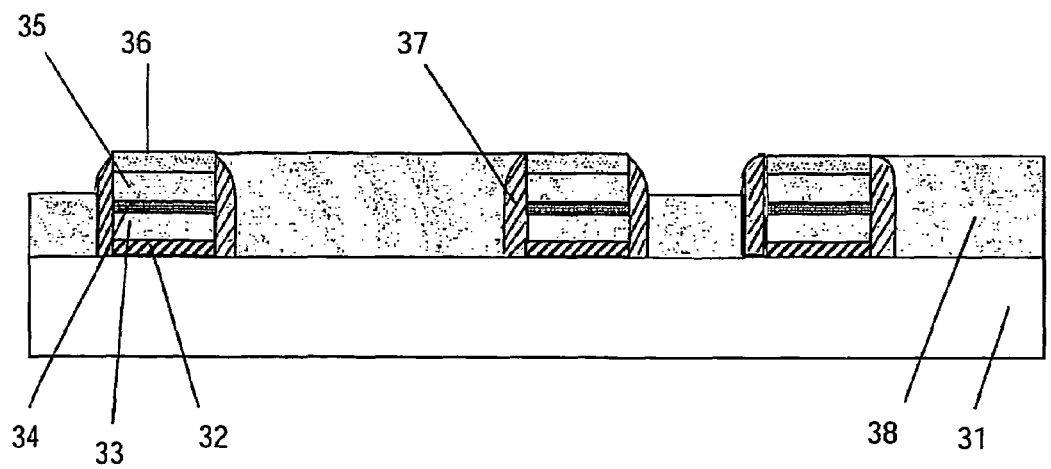
Figure 6:
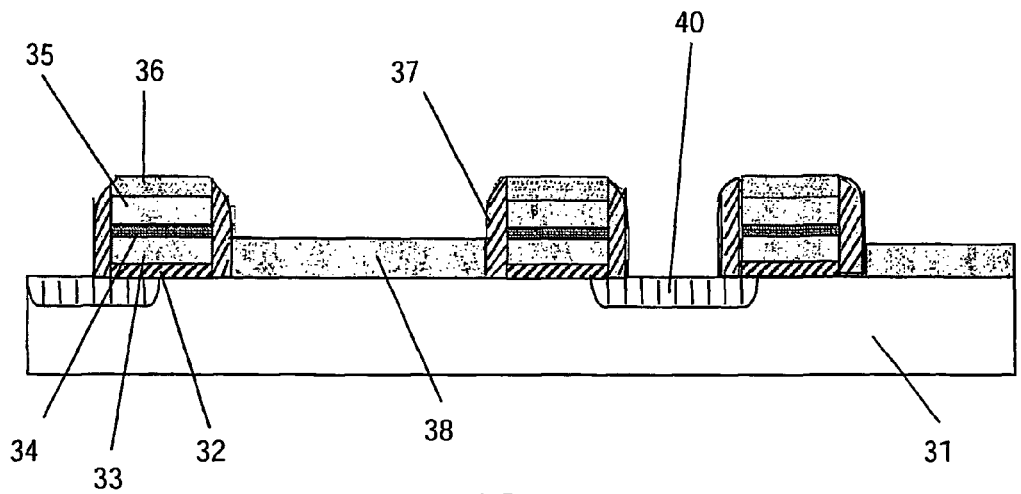

After etching of the conductive layer 38 and removal of the mask 39, the structure looks as shown in FIG. 5 and the remaining parts of the conductive layer 38 are etched back with a selective etch towards the access gate oxide or tunnel barrier 32 if present and the capping layer 36. Preferably, this etching back is stopped as soon as conductive layer 38 is completely removed at locations where no access gate is to be formed. In this case, the difference in height between the thickness of the conductive layer 38 after the first etching using mask 39, defines the thickness of the access gate to be formed. After etching back, the height of the remaining part of the conductive layer 38 is preferably sufficiently below the bottom level of the control gate 35 (FIG. 6), for example the remaining part of the conductive layer 38 has a thickness of 100 nm or less. In that way, a high voltage on the control gate 35 cannot lead to an electrical breakdown between the access gate 44 and the control gate 35. In the prior art device (as shown in FIG. 2) the isolation spacer 3 has to be thick enough to prevent problems with high voltages at the control gate 6.

The spacer 3 has to be thick enough to prevent electrical breakdown between the access gate 2 and the control gate 6. Therefore, between the access gate channel and the channel below the charge storage layer a relatively thick oxide spacer needs to be applied. According to this aspect of the present invention, a relatively thin oxide spacer can be used. When, in the present invention, the height of the remaining part of the conductive layer 38 is below the level of the interlayer dielectric 34, the distance between control gate 35 and access gate 44 will be sufficient to optimize isolation toward the electrical characteristics of the device, which is important for SSI programming. This means that in accordance with the present invention the spacer 37 may be thinner than in case of the prior art device where the spacer 3 is also used as isolation between the control gate 35 and the access gate 44. The part of conductive layer 38 in between the double gate stacks where no access gate 44 is needed is completely removed. The remaining part of conductive layer 38 screens the source region 45.

In a next step a blanket drain implant may be done. The drain 40 is of a second conductivity type, opposite with respect to the conductivity type of the substrate 31. By performing the drain implant at an angle, or by diffusion, or by a combination of both, an overlap between the floating gate 33 and the drain 40 is achieved, called a drain junction. A deep drain implant is carried out in order to be able to program the device.

The overlap can be used for drain erase. The drain junction is suitable for low voltage Fowler-Nordheim (FN) erase, because the normal voltage drop due to coupling is not present. With drain erase, the erase voltage is lower than with standard channel FN erase via coupling between the control gate 35 and the floating gate 33. Together with a low voltage method like this drain erase method a low program method like source side injection (SSI) can be used with a memory cell with an access gate transistor.

Figure 7:
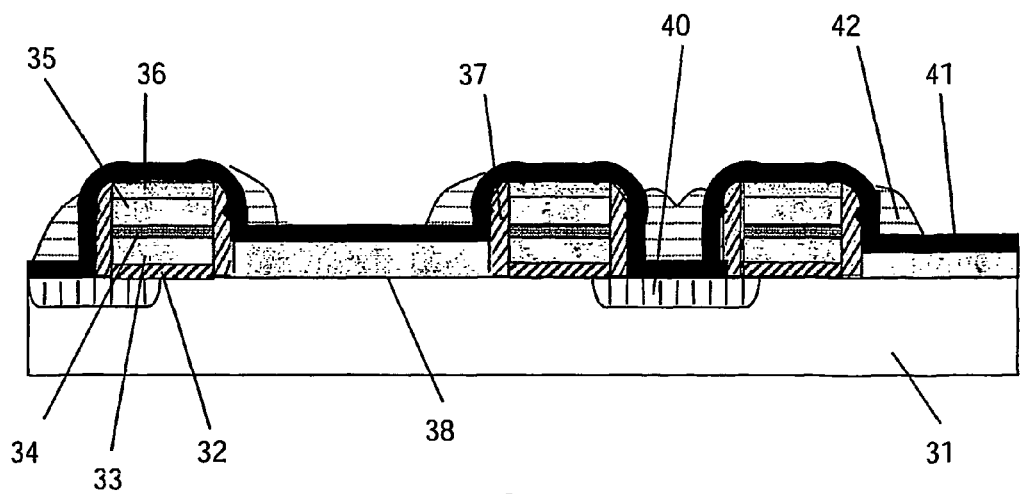

In a further step of the method of the present invention a thin first masking layer 41, which may for example have a thickness between 5 and 40 nm, and a thicker second masking layer which may for example have a thickness between 100 and 300 nm are deposited onto the device (see FIG. 7). The first masking layer 41 may for example be a nitride layer and the second masking layer may for example be an oxide layer. Other combinations of layers may also be used, but the first masking layer 41 should be suitable for selective etching towards the second masking layer and the conductive layer 38. When the thickness of the conductive layer 38 is less than 100 nm, the first masking layer 41, later used as a hardmask to etch the access gates 44, may have a thickness of for example less than 30 nm. However, the thickness of the first masking layer 41 and of the second masking layer are determined by the desired length of the access gate 44 to be formed.

Figure 8:
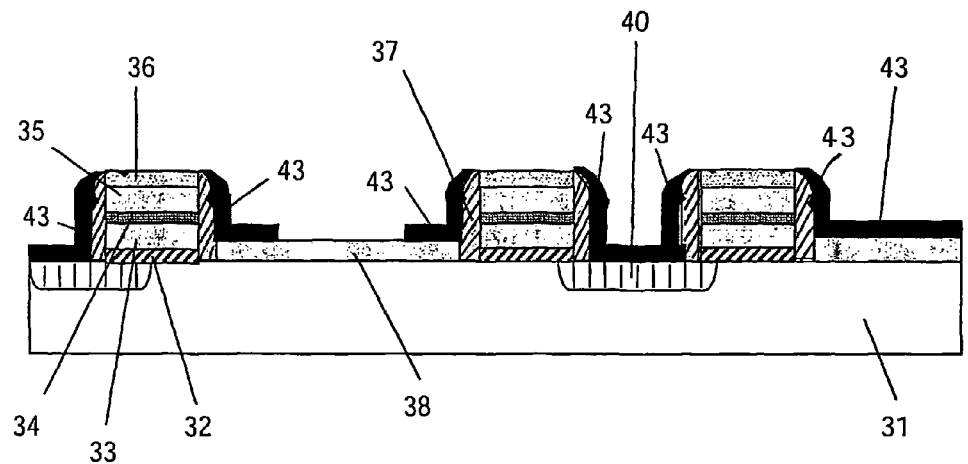

The second masking layer is etched into spacers 42, for example oxide spacers, as illustrated in FIG. 7, by any suitable means. The oxide spacers 42 formed are used as hardmask to etch the first masking layer 41 into L-shaped spacers 43 (see FIG. 8). The oxide spacers 42 protect the drain region in-between two adjacent double gate stacks sharing a drain region. This protection of the drain region is advantageous, because otherwise the first masking layer 41 would be etched and subsequent the substrate 31 would be attacked during etching of the access gate 44. After etching the first masking layer 41, the oxide spacers 42 are removed. The result is illustrated in FIG. 8. This removal of oxide spacers 42 can be done by means of for example a HF-dip. The HF-dip cannot attack any vital area like STI (shallow trench isolation) because these are protected by the first masking layer 41 and by the conductive layer 38 (see FIG. 8). Other methods can be used to remove the spacers 42, depending on which material has been used to form the second masking layer 42.

The L-shaped spacers 43 are then used as a hard mask to form the access gates 44 by removing the unprotected parts of the remaining part of conductive layer 38.

After formation of the access gates 44, the L-shaped spacers 43 may be removed by, for example, a dry or a wet etch. Important is that the etch method used is selective towards the previously formed spacers 37 and towards the conductive layer 38. The removal of the L-shaped spacers 43 is not necessary but preferred. If the L-shaped spacers 43 and the capping layer 36 are made out of the same material, e.g. nitride, the capping layer 36 will be removed with the L-shaped spacers 43.

After removal of the L-shaped spacers 43, the process can be finished with standard processing. A lightly or medium doped drain (LDD or MDD) implant is performed, thus forming source regions 45. During this source region implant, further implantation in the drain region may be performed. If the capping layer 36 is removed with the L-shaped spacers 43, the control gate 35 may be doped during LDD or MDD implant. The control gate 35 may then previously be formed from e.g. undoped polysilicon.

After this lightly or medium doped implant and its activation, offset spacers 46, e.g. nitride spacers or TEOS spacers, are formed alongside the spacers 37. The composition and dimensions of the spacers 46 may vary. The offset spacers 46 may be for example formed out of silicon nitride or silicon oxide. After formation of the offset spacers, typically a shallow HDD implant is carried out.

Finally, to finish the front-end processing; the uncovered silicon and polysilicon areas are provided with a conductive layer 47, for example they may be silicidized. For the silicidation process for example a metal silicide 47 such as titanium silicide or the like may be used. By silicidation of the gates, the gates get a relatively low electrical resistance. No bridging across the offset spacers 46 should occur.

Figure 9:
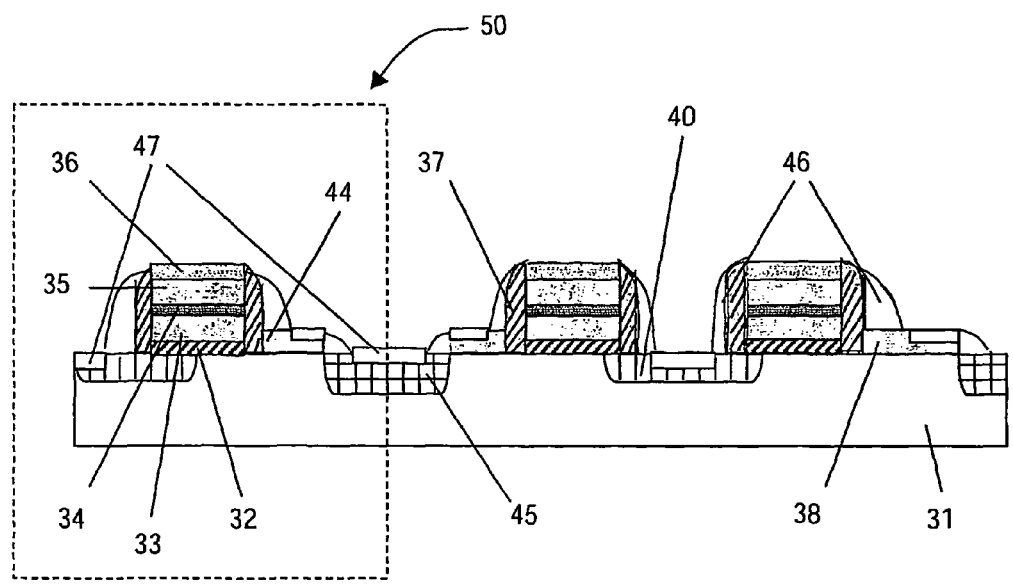

The resulting device, after silicidation, is shown in FIG. 9 for the case where the capping layer 36 is not removed with the L-shaped spacers 43. If the capping layer 36 is removed with the L-shaped spacers 43, then the control gate 35 is silicided as well (not represented in the drawings).

After the above steps, standard back-end processing can be applied to finish the manufacture of the NVM semiconductor devices, such as e.g. providing contacts and metal interconnects (not shown in the drawings).

By applying the method of the above described embodiment, a compact NVM memory cell 50 comprising a double gate stack and a single access gate 44 is formed. This is advantageous with respect to the method described in the prior art, where in one memory cell two access gates are formed, and one is to be removed afterwards.

Furthermore, neighboring memory cells 50 have shared drain 40 and source 45 regions and are each others mirror image. Besides, by using the method of the present invention, drain 40 and source 45 with different doping levels may be provided separately without the need of an additional mask step.

In yet another embodiment of the present invention (not represented in the drawings), instead of the combined nitride/oxide spacers 43, 42 as described in the previous embodiment, for example only nitride spacers can be used as hard mask to etch the access gate 44 self-aligned. In this case, only a first masking layer 41 is provided, which is then thicker than the first masking layer of the previous embodiment, for example has the thickness of the first masking layer 41 and second masking layer of the previous embodiment together. A disadvantage in respect with the previous embodiment is now the removal of the thick nitride spacers instead of the thin L-shaped nitride spacers 43 in the previous embodiment. Removal of these thick nitride spacers may for example be done by a wet etch in phosphoric acid, but in that case also n⁺ polysilicon 38 is attacked. A solution to this problem is the use of undoped polysilicon as a conductive layer 38 to form the access gate 44, because undoped poly is not attacked during the wet etch. After nitride spacer removal the access gate can then be doped with the HDD implant.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method for processing an electric device which comprises a double gate stack and a single access gate, the method comprising:
    first providing the double gate stack having a first sidewall adjacent which the access gate is to be formed, and a second sidewall opposite to the first sidewall,
    thereafter providing a conductive layer over and adjacent the double gate stack,
    thereafter partially removing said conductive layer adjacent the second sidewall,
    after the partial removal of the conductive layer etching back said conductive layer, both adjacent the first sidewall and adjacent the second sidewall, until the conductive layer is substantially completely removed adjacent the second sidewall, a part of the conductive layer remaining for forming the access gate adjacent the first sidewall, the remaining part of the conductive layer having a top surface, wherein the top surface of the remaining part of said conductive layer is below the level of an interlayer dielectric of said double gate stack.

2. A method according to claim 1, the method further comprising after etching back of the conductive layer, deposition of a masking layer for masking the remaining part of the conductive layer where the access gate having a length is to be formed, and formation of a spacer from the masking layer for defining the length of the access gate.

3. A method according to claim 2, the masking layer comprising a first masking layer and a second masking layer, said first masking layer being suitable for being selectively etched towards said second masking layer; the method further comprising
    forming first spacers from said second masking layer, and partly removing said first masking layer using the first spacers as hardmask.

4. A method according to claim 3, removing of the first masking layer using the spacers as hardmask generating second spacers, the method furthermore comprising removing the conductive layer using the second spacers as a hardmask.

5. A method according to claim 4, wherein the first spacers protect a drain region of a double gate stack during removal of the conductive layer using the second spacers as a hardmask.

6. A method according to claim 1, wherein a drain region and a source region having independent doping concentrations are separately formed.

7. A method according to claim 6, wherein said drain region is implanted after etching back of the conductive layer, but while said source region is still covered by the conductive layer.

8. A method according to claim 3, wherein said first masking layer is a nitride layer and said second masking layer is an oxide layer.

* * * * *